United States Patent
Sandaresan

Patent Number: 6,064,077
Date of Patent: May 16, 2000

[54] INTEGRATED CIRCUIT TRANSISTOR

[75] Inventor: Ravishankar Sandaresan, Garland, Tex.

[73] Assignee: STMicroelectronics, Inc., Carrollton, Tex.

[21] Appl. No.: 08/350,504

[22] Filed: Dec. 6, 1994

Related U.S. Application Data

[63] Continuation of application No. 08/254,286, Jun. 6, 1994, abandoned, which is a continuation-in-part of application No. 07/752,863, Aug. 30, 1991, abandoned.

[51] Int. Cl.$^7$ .......................... H01L 29/76; H01L 29/94; H01L 31/062
[52] U.S. Cl. .......................... 257/23; 257/327; 257/336; 257/387; 257/550; 257/344; 257/408; 257/329; 257/335; 257/337; 257/338; 257/339
[58] Field of Search .................... 357/23.3, 23.4, 357/23.11; 257/327, 336, 387, 550, 344, 408, 328, 329, 335, 337, 338, 339

[56] References Cited

U.S. PATENT DOCUMENTS

| | | | |
|---|---|---|---|
| 4,242,691 | 12/1980 | Kotani et al. | 257/327 |
| 4,939,386 | 7/1990 | Shibata et al. | 257/336 |
| 5,196,908 | 3/1993 | Kusunoki et al. | 257/327 |
| 5,245,208 | 9/1993 | Eimori | 257/344 |

FOREIGN PATENT DOCUMENTS

| | | | |
|---|---|---|---|
| 0436038A1 | 7/1991 | European Pat. Off. . | |
| 60-235471 | 11/1985 | Japan | 257/345 |
| 63-73666 | 4/1988 | Japan . | |
| 73666 | 4/1988 | Japan | 357/23.3 |
| 236364 | 10/1988 | Japan | 357/23.3 |
| 1-86559 | 3/1989 | Japan | 257/344 |
| 282576 | 3/1990 | Japan | 357/23.3 |
| 82576 | 3/1990 | Japan | 357/23.3 |

OTHER PUBLICATIONS

7th Biennial University/Government/Industry Microelectronics Symposium, Rochester, NY, Jun. 11, 1987, pp. 28–33, F. C. Jain "Improved LDD–FET structures with lightly doped n– sheaths around the n+ source/drain regions".

*Primary Examiner*—Mahshid Saadat
*Assistant Examiner*—Matthew E. Warren
*Attorney, Agent, or Firm*—Theodore E. Galanthay; Lisa K. Jorgenson; Dan Venglarik

[57] ABSTRACT

A method for fabricating an integrated circuit transistor begins with doping the substrate in the device active areas after field oxide regions have been formed. This dopant helps to reduce short channel transistor effects. A thin layer of epitaxial silicon is then grown over the substrate active regions. A field effect transistor is formed in the epitaxial layer and underlying substrate. The transistor channel region is in the relatively lightly doped epitaxial layer, but the underlying doped substrate layer helps minimize short channel effects.

4 Claims, 1 Drawing Sheet

INTEGRATED CIRCUIT TRANSISTOR

This is a continuation of application Ser. No. 08/254,286, filed Jun. 6, 1994, now abandoned, which is a continuation of application Ser. No. 07/752,863, filed Aug. 30, 1991, now abandoned.

BACKGROUND OF THE INVENTION

1. Field of the Invention

The present invention relates generally to integrated circuit devices, and more specifically to a transistor suitable for use in integrated circuit devices having small feature sizes.

2. Description of the Prior Art

As semiconductor integrated circuits continue to become smaller, it becomes increasingly difficult to fabricate transistors which operate reliably and predictably. As device feature sizes shrink to dimensions well below one micron, transistors become strongly affected by short channel effects.

Short channel effects occur as a result of the voltage field at the drain. Since the channel is very short, the electric fields from both the gate and drain affect the flow of current through the channel, changing operation of the transistor from the desired parameters. If the drain electric field is strong enough, the depletion region can extend all the way to the source, resulting in punch through.

Short channel effects can mostly be negated by increasing the dopant concentration in the channel region. However, undesirable side effects occur as a result of increasing the dopant concentration. Carrier mobility is degraded, lowering transistor gain, and threshold voltage ($V_t$) is increased.

It would be desirable to provide a transistor structure, and method for making same, which provides improved avoidance of short channel effects without unduly adversely affecting transistor operating characteristics. It would be further desirable for such a structure and method to be compatible with widely available fabrication techniques.

SUMMARY OF THE INVENTION

Therefore, according to the present invention, a method for fabricating an integrated circuit transistor begins with doping the substrate in the device active areas after field oxide regions have been formed. This dopant helps to reduce short channel transistor effects. A thin layer of epitaxial silicon is then grown over the substrate active regions. A field effect transistor is formed in the epitaxial layer and underlying substrate. The transistor channel region is in the relatively lightly doped epitaxial layer, but the underlying doped substrate layer helps minimize short channel effects.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
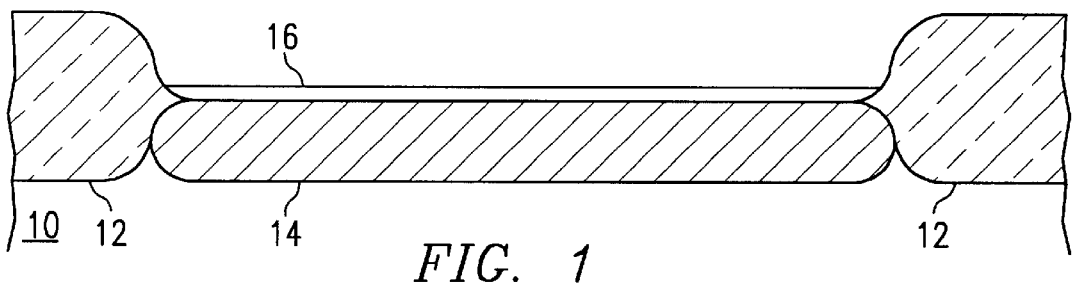
FIGS. 1–3 illustrate one preferred method for forming integrated circuit structures according to the present invention.

Referring to FIG. 1, a substrate 10 is used for the formation of integrated circuit devices. Field oxide regions 12 are formed in the substrate 10 as known in the art. An upper surface region 14 of the substrate 10 is doped with a moderate amount of impurities.

The dopant concentration for region 14 is selected to be a moderate level which allows short channel effects to be controlled. If an n-channel transistor is to be formed, the region 14 can be doped with, for example, approximately $5 \times 10^{17}$ atoms/cm$^3$ of boron. The dopant in region 14 may be implanted or diffused into the substrate 10 as known in the art.

A thin epitaxial silicon region 16 is then grown on the substrate 10. Epitaxial region 16 may be grown using molecular beam epitaxy (MBE) or a low temperature epitaxial growth process. Low temperature processes, less than approximately 850° C., are preferably used to minimize outdiffusion of dopant from the region 14. Layer 16 is preferably grown to a thickness of approximately 500–1000 angstroms, and will contain the channel of the field effect transistor to be formed.

Figure 2:
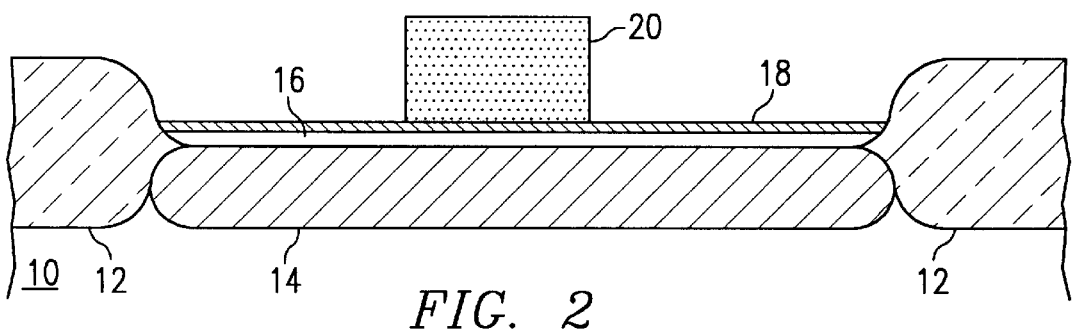

Referring to FIG. 2, a thermal oxidation step is performed to convert a portion of the epitaxial layer 16 to gate oxide 18. Gate oxide layer 18 is preferably less than approximately 150 angstroms thick. A polycrystalline silicon layer is then deposited over the entire device and patterned as known in the art to form a polycrystalline silicon gate electrode 20. If desired, the polycrystalline silicon layer can be doped before patterning, and the polycrystalline silicon electrode 20 can be formed to include a refractory metal silicide to improve conductivity. Such techniques are well known in the art.

Figure 3:
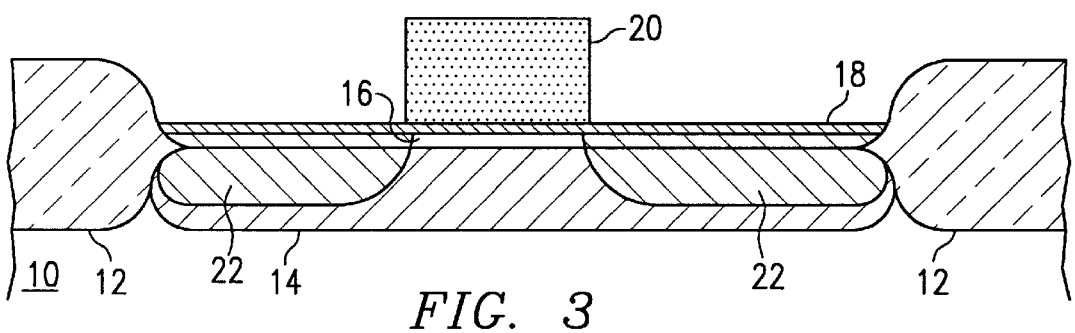

Referring to FIG. 3, source/drain regions 22 are formed in the substrate 10 and epitaxial layer 18 by implantation and anneal as known in the art. The source/drain region 22 junction extends into the moderately doped region 14. The extension of this junction into the region 14 minimizes the short channel effect due to its higher dopant concentration. The channel of the transistor is formed in the epitaxial layer 16 beneath the gate electrode 20. Since the epitaxial layer 16 is relatively lightly doped, the resulting transistor has good operating characteristics. If desired, prior to the formation of the polycrystalline silicon layer over the gate oxide layer 18, a $V_t$ adjust implant can be made into the epitaxial layer 16 in order to set the threshold voltage of the transistor to a desired value. Dopant outdiffusion from the moderately doped region 14 during epitaxial growth and later processing steps will also tend to vary the threshold voltage somewhat, and the $V_t$ implant may not be necessary.

Figure 4:
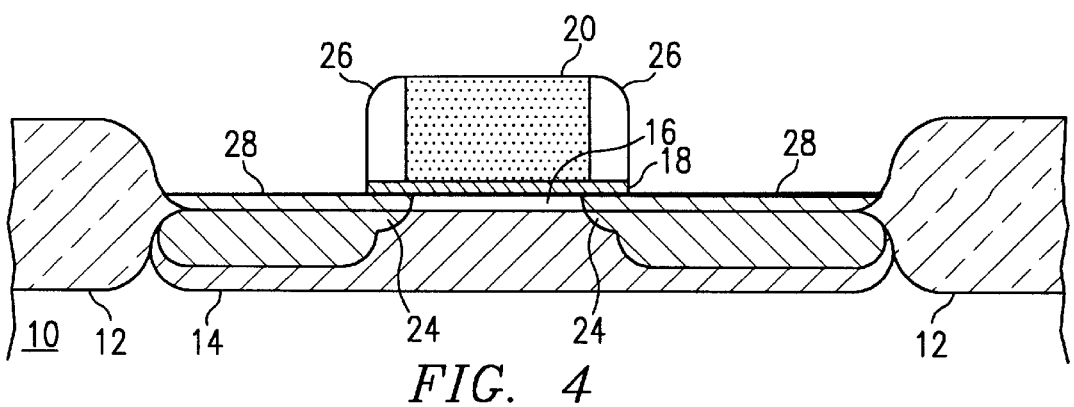
FIG. 4 illustrates an alternative integrated circuit structure formed in accordance with the present invention.

Referring to FIG. 4, the technique of growing the additional epitaxial layer 16 can be used to form a self-aligned, lightly doped drain (LDD) structure. As known in the art, after patterning of the gate electrode 20, an LDD implant is made to form lightly doped source/drain regions 24. Sidewall oxide regions 26 are then formed along side the gate electrode 20 using an oxide deposition and anisotropic etch as known in the art, followed by implant of the heavily doped source/drain regions 28. As before, the extension of the source/drain region junctions into the moderately doped region 14 reduces short channel effects, while the formation of the transistor channel in the lighter doped epitaxial layer 16 underneath a gate 20 produces a transistor having good operating characteristics.

As an alternative to growing the epitaxial layer 16 in FIG. 1, a selective amorphous silicon deposition may be performed followed by a solid-phase epitaxial regrowth of the amorphous silicon. Such a regrowth step may be performed at approximately 550° C.–600° C. as known in the art.

As will be appreciated by those skilled in the art, the technique described above results in a transistor which suffers minimal degradation from short channel effects, and has good operating characteristics due to the channel being formed in a relatively lightly doped epitaxial layer. Formation of the epitaxial layer 16 adds only minimal complexity to standard process flows, and allows high quality transistors to be fabricated using feature sizes of approximately one-half micron and less.

While the invention has been particularly shown and described with reference to a preferred embodiment, it will be understood by those skilled in the art that various changes in form and detail may be made therein without departing from the spirit and scope of the invention.

What is claimed is:

1. An integrated circuit device, comprising:

a substrate having a doped region therein, said doped region having a first doping level;

an epitaxial silicon region overlying the doped substrate region, said epitaxial silicon region having a second doping level that is less than said first doping level;

a gate insulating layer and gate electrode overlying the epitaxial silicon region, wherein a channel region is formed under the gate electrode in said epitaxial silicon region;

sidewall insulating regions disposed alongside said gate electrode;

lightly doped source/drain regions in said epitaxial silicon region and said substrate underneath said sidewall insulating regions and adjacent the channel region;

highly doped source/drain regions in said doped substrate region and said epitaxial silicon region adjacent the lightly doped source/drain regions, each of said highly doped source/drain regions extending from an upper surface of said epitaxial silicon region into said doped substrate region; and a threshold adjust impurity region within the channel region.

2. The device of claim 1, wherein said gate insulating layer comprises oxide.

3. The device of claim 1, wherein the doped substrate region has an impurity concentration of approximately $5 \times 10^{17}$ atoms/cm$^3$.

4. The device of claim 1, wherein said gate electrode has a width less than approximately 0.5 micron.

\* \* \* \* \*